(12) United States Patent
Horiuchi et al.

(10) Patent No.: US 8,462,099 B2
(45) Date of Patent: Jun. 11, 2013

(54) DISPLAY PANEL AND DISPLAY DEVICE

(75) Inventors: Satoshi Horiuchi, Osaka (JP); Toshiaki Fujihara, Osaka (JP); Takaharu Yamada, Osaka (JP); Isao Ogasawara, Osaka (JP); Hironobu Sawada, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 571 days.

(21) Appl. No.: 12/733,231

(22) PCT Filed: Jul. 4, 2008

(86) PCT No.: PCT/JP2008/062225
§ 371 (c)(1),
(2), (4) Date: Feb. 18, 2010

(87) PCT Pub. No.: WO2009/054166
PCT Pub. Date: Apr. 30, 2009

(65) Prior Publication Data
US 2010/0141570 A1 Jun. 10, 2010

(30) Foreign Application Priority Data
Oct. 24, 2007 (JP) .................................. 2007-276330

(51) Int. Cl.
*G09G 3/36* (2006.01)

(52) U.S. Cl.
USPC ................. 345/100; 345/84; 345/88; 345/89; 345/92; 345/690; 377/64

(58) Field of Classification Search
USPC ............. 345/84, 88–100, 103, 156–173, 690, 345/87; 377/64
See application file for complete search history.

(56) References Cited

U.S. PATENT DOCUMENTS

| | | | |
|---|---|---|---|
| 5,995,075 A | 11/1999 | Vignolle | |
| 6,359,607 B1 | 3/2002 | Yanagi et al. | |
| 2002/0057245 A1 | 5/2002 | Yanagi et al. | |
| 2002/0149318 A1 | 10/2002 | Jeon et al. | |
| 2004/0090412 A1* | 5/2004 | Jeon et al. | 345/100 |
| 2004/0246245 A1 | 12/2004 | Yanagi et al. | |
| 2005/0225690 A1* | 10/2005 | Battersby | 349/41 |
| 2006/0077163 A1 | 4/2006 | Yanagi et al. | |
| 2008/0012813 A1 | 1/2008 | Yanagi et al. | |
| 2008/0048934 A1 | 2/2008 | Yamamoto et al. | |
| 2009/0102824 A1 | 4/2009 | Tanaka et al. | |

FOREIGN PATENT DOCUMENTS
| | | |
|---|---|---|
| CN | 1656530 | 8/2005 |
| JP | 10-504911 | 5/1998 |

(Continued)

OTHER PUBLICATIONS

English version of ISR.

*Primary Examiner* — Lun-Yi Lao
*Assistant Examiner* — Insa Sadio
(74) *Attorney, Agent, or Firm* — Harness, Dickey & Pierce (57) ABSTRACT

In one embodiment of the present invention, a display panel includes an active matrix type pixel region including scanning signal lines each of which is connected to three terminal elements each of which serves as an active element, the active matrix type pixel region including a non-rectangular shape by being configured such that the respective scanning signal lines are connected with various numbers of the three terminal elements according to where the scanning signal lines are located, and a shift register which drives the scanning signal lines, the shift register being formed in a region on a panel substrate, the region being adjacent to the pixel region in a direction in which the scanning signal lines extend.

16 Claims, 9 Drawing Sheets

FOREIGN PATENT DOCUMENTS

| | | |
|---|---|---|
| JP | 11-281957 | 10/1999 |
| JP | 2002-258819 | 9/2002 |
| JP | 2005-528644 | 9/2005 |
| JP | 2006-276360 | 10/2006 |
| JP | 2008-65198 | 3/2008 |
| WO | WO 93/04460 | 3/1993 |
| WO | WO 2007-105700 | 9/2007 |

* cited by examiner

DISPLAY PANEL AND DISPLAY DEVICE

TECHNICAL FIELD

The present invention relates to an odd-shaped display panel that is not rectangular in shape, and especially relates to driving of a scanning signal line.

BACKGROUND ART

An odd-shaped liquid crystal display panel whose display section is not rectangular (square) but circular or oval is proposed with the prospect that it is provided especially in a portable phone (see Patent Literature 1).

Figure 9:
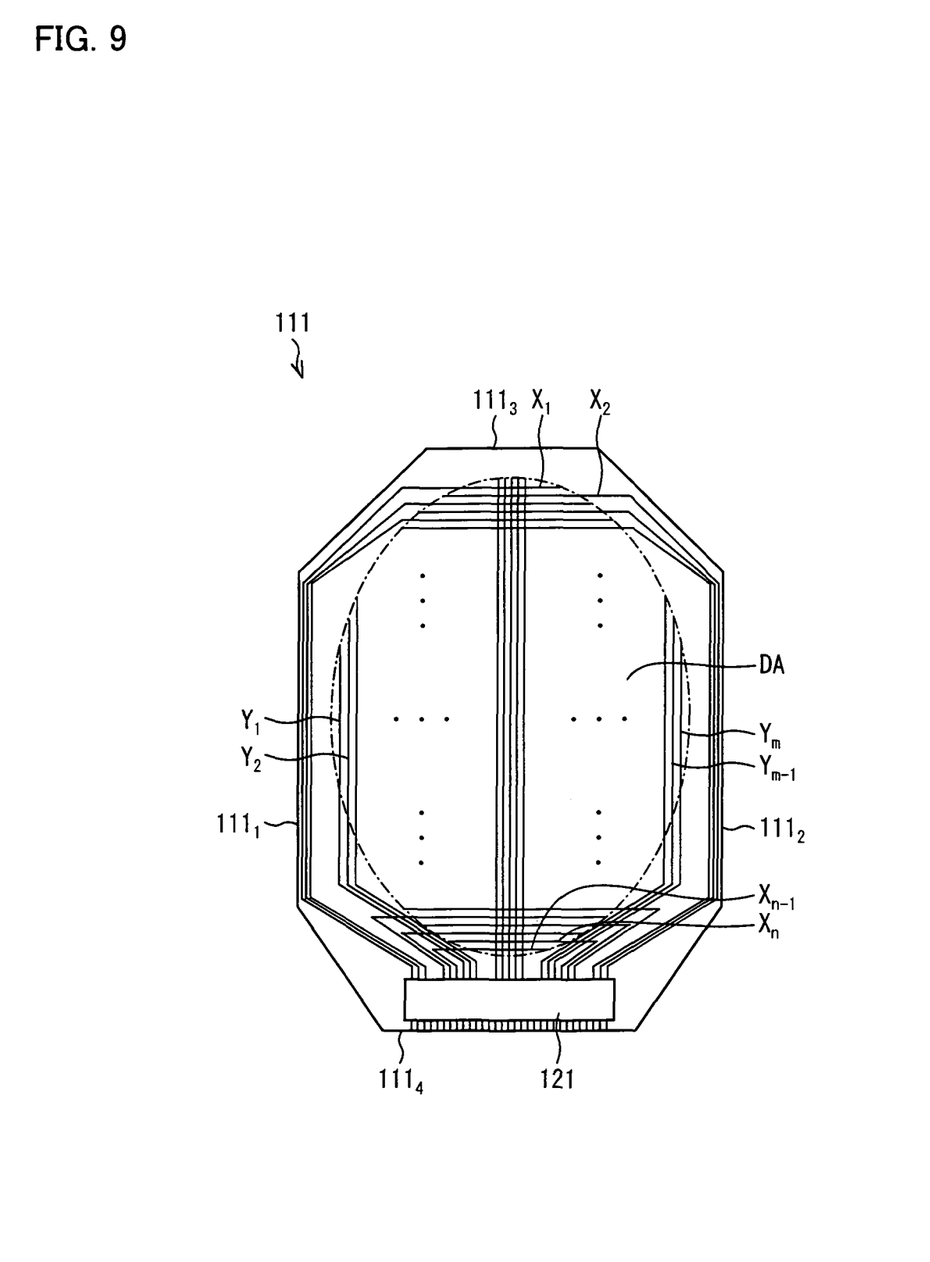
FIG. 9 is a plan view illustrating an arrangement of a conventional display device.

FIG. 9 is a plan view illustrating an odd-shaped liquid crystal display panel disclosed in Patent Literature 1.

FIG. 9 illustrates how the liquid crystal display panel is arranged on a first light-transmitting substrate 111 which is one of two bonded substrates constituting the liquid crystal display panel. A display area DA has an oval shape. The light-transmitting substrate 111 has a polygonal shape, in which corner section are removed from a rectangular substrate by cutting, in accordance with the shape of the display area DA, and when the light-transmitting substrate is mounted in a portable phone or the like, other constituents are disposed in portions where the corner sections were located. A plurality of scanning lines $X_1, \ldots, X_n$ and a plurality of signal lines $Y_1, \ldots, Y_m$ are disposed in a matrix manner on a surface onto which liquid crystal is disposed. In the display area DA, the plurality of scanning lines $X_1, \ldots, X_n$ extend in a first direction pointing from an edge $111_1$ of the substrate toward an edge $111_2$ that is opposite to the edge $111_1$. In the display area DA, the plurality of signal lines $Y_1, Y_m$ extend in a second direction pointing from an edge $111_3$ of the substrate toward an edge $111_4$ that is opposite to the edge $111_3$. The first direction and the second direction are perpendicular to each other.

The light transmitting substrate 111 includes, along the edge $111_4$, a driver placing area 121 in which a driver LSI, which is connected to each of the plurality of scanning lines $X_1, \ldots, X_n$ and the plurality of signal lines $Y_1, \ldots, Y_m$ and which supplies a control signal, is placed. The plurality of scanning lines $X_1, \ldots, X_n$ and the plurality of signal lines $Y_1, \ldots, Y_m$ are routed through an area outside the display area DA so as to be connected to the driver placing area 121. Thus, the first light-transmitting area 111 is an array substrate.

Each pixel of the display area DA includes a pixel electrode, an auxiliary capacitor electrode, a pixel transistor, a counter electrode, and a color filter, as in a conventional one. The number of pixel transistors connected to a scanning line represents the number of pixels connected to the scanning line.

CITATION LIST

Patent Literature 1
Japanese Patent Application Publication, Tokukai, No. 2006-276360 A (Publication Date: Oct. 12, 2006)
Patent Literature 2
Japanese Patent Application Publication, Tokukai, No. 2002-258819 A (Publication Date: Sep. 11, 2002)

SUMMARY OF INVENTION

However, according to the conventional odd-shaped liquid crystal display panel in which the corner sections are removed from the rectangular substrate by cutting, wires which connects the driver placing area 121 to the plurality of scanning lines $X_1, \ldots, X_n$ need to be provided in narrow areas between the display area DA and cut edges formed by the cutting. The number of wires corresponds to resolution of the display area DA, and is large, for example, 480 in a case of panel resolution of VGA. Even if (i) wires connected to odd-numbered rows of the plurality of scanning lines $X_1, \ldots, X_n$ are routed through one of the narrow areas, and (ii) wires connected to even-numbered rows of the plurality of scanning lines $X_1, \ldots, X_n$ are routed through the other one of the narrow areas, a large number of wires, i.e., 240 wires run through each of the narrow areas. As such, the odd-shaped liquid crystal display panel produces a problem that it is very difficult to dispose such peripheral wires.

The present invention was attained in view of the above problem, and an object of the present invention is to realize a display panel and a display device each of which includes an odd-shaped pixel region that is not rectangular and in which an area where peripheral wires are routed outside the pixel region can be reduced.

In order to attain the above object, a display panel of the present invention includes: an active matrix type pixel region including scanning signal lines each of which is connected to three terminal elements each of which serves as an active element, the active matrix type pixel region having a non-rectangular shape by being configured such that the respective scanning signal lines are connected with various numbers of the three terminal elements according to where the scanning signal lines are located, and a shift register which drives the scanning signal lines, the shift register being formed in a region on a panel substrate, the region being adjacent to the pixel region in a direction in which the scanning signal lines extend.

According to the invention, the active matrix type pixel region having a non-rectangular shape by being configured such that the respective scanning signal lines are connected with various numbers of the three terminal elements according to where the scanning signal lines are located, and a shift register which drives the scanning signal lines is formed in a region on a panel substrate, the region being adjacent to the pixel region in a direction in which the scanning signal lines extend. With this arrangement, it is unnecessary for the scanning signal lines to be routed, outside the pixel region, from a section (e.g. a driver from which the data signal lines are also extended) other than an area adjacent to the pixel region in the direction in which the scanning signal lines are extended. Only several wires need to be extended, to the shift register, from the section other than the area adjacent to the pixel region.

Thus, it is possible to realize a display panel which includes an odd-shaped pixel region that is not rectangular in shape, and in which an area where peripheral wires are routed outside the pixel region can be reduced.

In order to attain the above object, the display panel of the present invention is arranged such that the shift register includes stages disposed along a part of a periphery of the pixel region which part is adjacent to the shift register, and a part of a periphery of the panel substrate which part is adjacent to the shift register has a shape curved according to a curved shape of the part of the periphery of the pixel region.

According to the invention, an area where the shift register is formed can be reduced to a minimum. As such, it is possible to (i) reduce the size of the display panel and (ii) provide the display panel in an apparatus which can take advantage of the odd-shape of the display panel.

In order to attain the above object, the display panel of the present invention is arranged such that the shift register includes that plurality of the stages which have an arrangement such that an output impedance in at least one of a transient state from a non-conductive period to a conductive period of the three terminal elements and a transient state from the conductive period to the non-conductive period of the three terminal elements is set in accordance with the number of the three terminal elements connected to that one of the scanning signal lines to which the stage corresponds.

According to the invention, since the pixel region has a non-rectangular odd shape, the size of a wiring delay of one scanning signal line is different from that of another scanning signal line, but since an output impedance is set for each of the stages in the shift register, one scanning signal line can be the same as another scanning signal line in entire wiring delay obtained in a state where a stage is connected to a corresponding scanning signal line.

In order to attain the above object, the display panel of the present invention is arranged such that the shift register includes that plurality of the stages which have an arrangement such that an output impedance in at least one of the conductive period of the three terminal elements and the non-conductive period of the three terminal elements is set in accordance with the number of the three terminal elements connected to that one of the scanning signal lines to which the stage corresponds.

According to the invention, an output impedance during the transient period from the non-conductive period to the conductive period of the three terminal elements can be maintained during the conductive period of the three terminal elements, and an output impedance during the transient period from the conductive period to the non-conductive period of the three terminal elements can be maintained during the non-conductive period of the three terminal elements. As such, in a case where an output impedance in at least one of the conductive period of the three terminal elements and the non-conductive period of the three terminal elements is set in accordance with the number of the three terminal elements connected to that one of the scanning signal lines to which the stage corresponds, one scanning signal line can be the same as another scanning signal line in entire wiring delay obtained in a state where a stage is connected to a corresponding scanning signal line.

In order to attain the above object, the display panel of the present invention is arranged such that the stages except a first stage and a last stage include stages having the arrangement.

According to the invention, since the pixel region has a non-rectangular odd shape, the size of a wiring delay of one scanning signal line is different from that of another scanning signal line, but since an output impedance is set for each of the stages in the shift register, one scanning signal line can be the same as another scanning signal line in entire wiring delay obtained in a state where a stage is connected to a corresponding scanning signal line.

In order to attain the above object, the display panel of the present invention is arranged such that each of the stages in the shift register which stages have the arrangement includes a first transistor in a predetermined position, the first transistor having a channel width which becomes larger as the number of the three terminal elements connected to the scanning signal line to which the stage corresponds becomes larger, the output impedance becoming smaller as the channel width of the first transistor becomes larger.

According to the invention, the channel width of the first transistor becomes larger as a wiring delay of a corresponding scanning signal line becomes larger so that an output impedance of a stage becomes smaller. As such, one scanning signal line can be the same as another scanning signal line in entire wiring delay obtained in a state where a stage is connected to a corresponding scanning signal line.

In order to attain the above object, the display panel of the present invention is arranged such that each of the stages in the shift register which stages have the arrangement includes a first transistor in a predetermined position, the first transistor having a channel length which becomes smaller as the number of the three terminal elements connected to the scanning signal line to which the stage corresponds becomes larger, the output impedance becoming smaller as the channel length of the first transistor becomes smaller.

According to the invention, the channel length of the first transistor becomes smaller as a wiring delay of a corresponding scanning signal line becomes larger so that an output impedance of a stage becomes smaller. As such, one scanning signal line can be the same as another scanning signal line in entire wiring delay obtained in a state where a stage is connected to a corresponding scanning signal line.

In order to attain the above object, the display panel of the present invention is arranged such that the first transistor is a transistor that is provided in an output section for supplying a scanning signal to the scanning signal line to which the stage corresponds.

According to the invention, the first transistor is a transistor that is provided in the output section of a stage of the shift register. This makes it possible to easily set an output impedance.

In order to attain the above object, the display panel of the present invention is arranged such that the output section includes pull-up means which generates a high-side voltage of the scanning signal and pull-down means which generates a low-side voltage of the scanning signal, and the first transistor serves as the pull-up means.

According to the invention, the first transistor is a transistor which serves as the pull-up means provided in the output section of a stage of the shift register. This makes it possible to easily set an output impedance.

In order to attain the above object, the display panel of the present invention is arranged such that the output section includes pull-up means which generates a high-side voltage of the scanning signal and pull-down means which generates a low-side voltage of the scanning signal, and the first transistor serves as the pull-down means.

According to the invention, the first transistor is a transistor which serves as the pull-up means provided in the output section of a stage of the shift register. This makes it possible to easily set an output impedance.

In order to attain the above object, the display panel of the present invention is arranged such that each of the stages in the shift register which stages have the arrangement includes a first capacitance element in a predetermined position, the first capacitance element having a capacitance value which becomes larger as the number of the three terminal elements connected to that one of the scanning signal line to which the stage corresponds becomes larger, the output impedance becoming smaller as the capacitance value of the first capacitance element becomes larger.

According to the invention, the capacitance value of the first capacitance element becomes larger as a wiring delay of a corresponding scanning signal line becomes larger so that an output impedance of a stage becomes smaller. As such, one scanning signal line can be the same as another scanning signal line in entire wiring delay obtained in a state where a stage is connected to a corresponding scanning signal line.

In order to attain the above object, the display panel of the present invention is arranged such that a channel width of each transistor in each of the stages of the shift register remains same or becomes larger as the number of the three terminal elements connected to that one of the scanning signal lines to which the stage corresponds becomes larger.

According to the invention, it is possible to easily set an output impedance.

In order to attain the above object, the display panel of the present invention is arranged such that a capacitance value of each capacitance element in each of the stages of the shift register remains same or becomes larger as the number of the three terminal elements connected to that one of the scanning signal lines to which the stage correspond becomes larger.

According to the invention, it is possible to easily set an output impedance.

In order to attain the above object, the display panel of the present invention is arranged such that the scanning signal has a waveform which falls from High to Low in a stepwise manner.

According to the invention, it is possible to prevent occurrence of distribution in wiring delay in a single scanning signal line.

In order to attain the above object, the display panel of the present invention is arranged such that set signals respectively supplied to the stages in the shift register which stages have the arrangement are generated in such a manner that each set signal corresponds to the stage to which the set signal is to be supplied.

According to the invention, it is possible to (i) set the set signals in accordance with output impedances of the stages, respectively, and (ii) stably operate the shift register.

In order to attain the above object, the display panel of the present invention is a liquid crystal display panel.

According to the invention, it is possible to realize a display panel which includes an odd-shaped pixel region that is not rectangular in shape, and in which an area where peripheral wires are routed outside the pixel region can be reduced.

In order to attain the above object, the display panel of the present invention includes the display panel.

According to the invention, the display device includes a display panel in which an area where peripheral wires are routed outside a pixel region is reduced. As such, it is possible to realize a small display device in which an area obtained by the reduction of the area where peripheral wires are routed can be utilized for other purposes.

Additional objects, advantages and novel features of the invention will be set forth in part in the description which follows, and in part will become apparent to those skilled in the art upon examination of the following or may be learned by practice of the invention.

REFERENCE SIGNS LIST

1: Liquid crystal display device
4: Shift register
AR1: Pixel region
S: Stage

DESCRIPTION OF EMBODIMENTS

One embodiment of the present invention is described below with reference to FIGS. 1 through 8.

Figure 1:
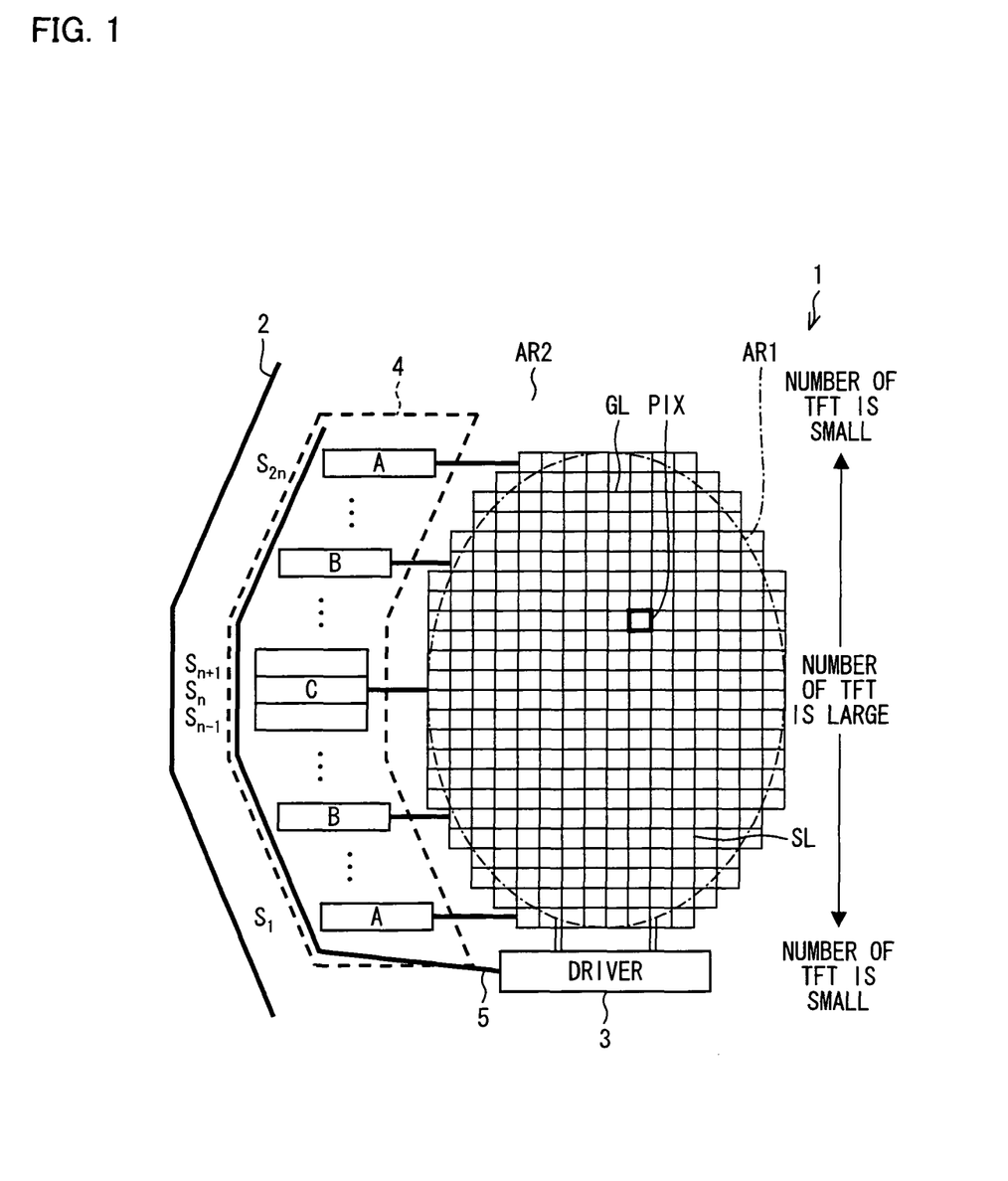
FIG. 1 is a plan view illustrating an arrangement of a display device according to an embodiment of the present invention.

FIG. 1 illustrates an arrangement of a liquid crystal display panel (display panel) 1 of the present embodiment.

The liquid crystal display panel 1 is an active matrix type display device, and is arranged such that a liquid crystal layer is disposed between a TFT substrate and a counter substrate which constitute a panel substrate. FIG. 1 illustrates how the liquid crystal display panel 1 is arranged on a TFT substrate 2.

The TFT substrate 2 is divided into a pixel region AR1 and a peripheral region AR2. The pixel region AR1 is a region where pixels PIX . . . are disposed in a matrix manner, and has an oval shape as a whole. The pixels PIX . . . may include a pixel that is not actually used in displaying, and the pixel region AR1 does not necessarily coincide with a panel opening region formed when a display device is constructed with the use of the liquid crystal display panel 1. The pixel PIX that is not actually used in displaying is often disposed, as a dummy pixel or the like, below a light-shielding section. The peripheral region AR2 is located around the pixel region AR1, and includes a driver 3, a shift register 4, scanning signal lines GL . . . , data signal lines SL . . . , and wires 5.

The driver 3 is provided, as an IC, in one of regions in the peripheral region AR2 which regions are adjacent to the pixel region AR1 in a long axis direction of the pixel region AR1. The driver 3 supplies several kinds of signals such as clock signals, a gate start pulse signal, and a low-side power supply voltage of a scanning signal to the shift register 4 via the wires 5 so as to drive the scanning signal lines GL . . . , and supplies, to the data signal lines SL . . . , a data signal of an image displayed with the use of pixels PIX.

The shift register 4 is formed on the TFT substrate 2 with the use of amorphous silicon or polysilicon so as to be located in one of regions in the peripheral region AR2 which regions are adjacent to the pixel region AR1 in a short axis direction of the pixel region AR1. The shift registers 4 includes a plurality of stages S which correspond to the scanning signal lines GL . . . , respectively, and causes the gate start pulse signal to be shifted from a stage on one end to a stage on the other end with the use of the clock signals received via the wires 5 so as to supply a scanning signal to the scanning signal lines GL . . . one by one.

In FIG. 1, the shift register 4 includes 2n stages S (S$_1$ to S$_{2n}$ in the order of proximity to the driver 3). The stages S are disposed along a peripheral area of the pixel region AR1. The wires 5 are disposed in the vicinity of the shift register 4 so as to be extended along the stages S. Further, a part of a periphery of the TFT substrate 2 which part is adjacent to the shift register 4 has a shape curved according to a curved shape of a corresponding part of a periphery of the pixel region AR1, and in FIG. 1, has a polygonal curved shape which is approximate to the curved shape of the corresponding part of the periphery of the pixel region AR1. Note that a part of the periphery of the TFT substrate 2 (panel substrate) which part is not illustrated in FIG. 1 may have any shape such as the shape shown in FIG. 9.

The scanning signal lines GL . . . are wires via which a scanning signal is supplied to the pixels PIX, and are extended in the short axis direction of the pixel region AR1. Here, the number of the scanning signal lines GL . . . is 2n which is equal to the number of stages of the shift register 4. The data signal lines SL . . . are wires via which a data signal is supplied to the pixels PIX, and are extended in the long axis direction of the pixel region AR2.

Figure 2:
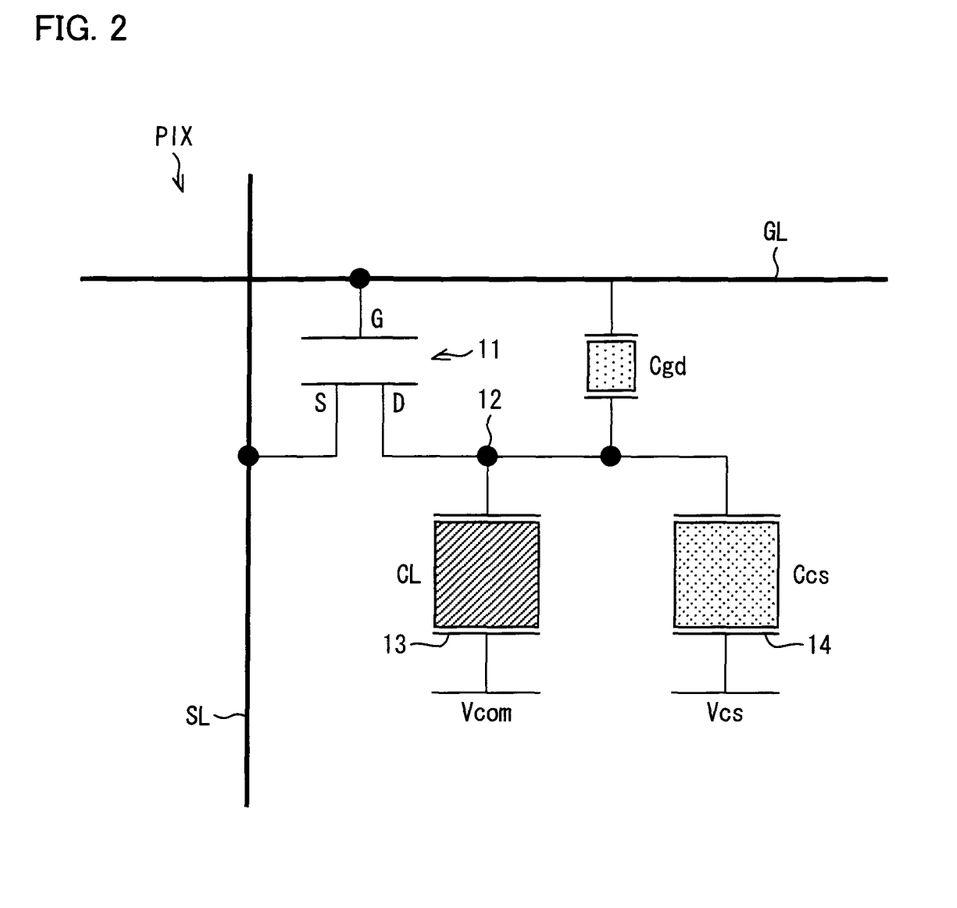
FIG. 2 is an equivalent circuit diagram illustrating an arrangement of a pixel included in the display device illustrated in FIG. 1.

FIG. 2 illustrates an arrangement of each of the pixels PIX.

The pixel PIX is provided at an intersection of a scanning signal line GL and a data signal line SL, and includes a TFT 11, a liquid crystal capacitance CL, and an auxiliary capacitance Ccs. A gate (G) of the TFT 11 is connected to the scanning signal line GL, a source (S) of the TFT11 is connected to the data signal line SL, and a drain (D) of the TFT 11 is connected to a pixel electrode 12. The liquid crystal capacitance CL is formed between the pixel electrode 12 and a counter electrode 13 supported by a counter voltage Vcom, and the auxiliary capacitance Ccs is formed between the pixel electrode 12 and an electrode 14 to which an auxiliary capacitance voltage such as the counter voltage Vcom is applied. Further, the pixel PIX also includes a parasitic capacitance Cgd formed between the pixel electrode 12 and the scanning signal line GL.

The TFT 11 is a three terminal element which serves as an active element in an active matrix type pixel. The TFT 11 becomes conductive in a case where a scanning signal which brings the pixel PIX into a selection period is applied to the gate via the scanning signal line GL, and becomes non-conductive in a case where a scanning signal which brings the pixel PIX into a non-selection period is applied to the gate via the scanning signal line GL. While the TFT 11 is being conductive, a data signal is supplied from the data signal line SL to the pixel PIX via the source and the drain of the TFT 11, whereas while the TFT 11 is being non-conductive, the pixel PIX preserves a state obtained when a data signal supplied during a previous selection period is written into the pixel PIX.

As is clear from the arrangement of the pixel PIX, a single TFT 11 is provided for each of the pixels PIX, and each of the scanning signal lines GL is connected to the TFTs 11 whose number corresponds to the length of a corresponding scanning signal line GL in the pixel region AR1. Here, since the pixel region AR1 has an oval shape, a scanning signal line GL nearer to the short axis is connected to a larger number of TFTs. Thus, in a display panel including an odd-shaped pixel region that is not rectangular (square) in shape, each scanning signal line GL is connected to TFTs whose number corresponds to a position where the scanning signal line GL is provided.

In the present embodiment, the shift register 4 which drives the scanning signal lines GL . . . is formed in the peripheral region AR2 which is adjacent to the pixel region AR1 in a direction in which the scanning signal lines GL . . . are extended, as described above. As such, it is unnecessary for the scanning signal lines GL . . . to be routed, outside the pixel region AR1, from a section (e.g. the driver 3 from which the data signal lines SL . . . are also extended) other than an area adjacent to the pixel region AR1 in the direction in which the scanning signal lines GL . . . are extended. Only several wires need to be extended, to the shift register 4, from the section other than the area adjacent to the pixel region AR1.

Thus, it is possible to realize a display panel which includes an odd-shaped pixel region that is not rectangular in shape and in which an area where peripheral wires are routed outside the pixel region can be reduced.

Figure 3:
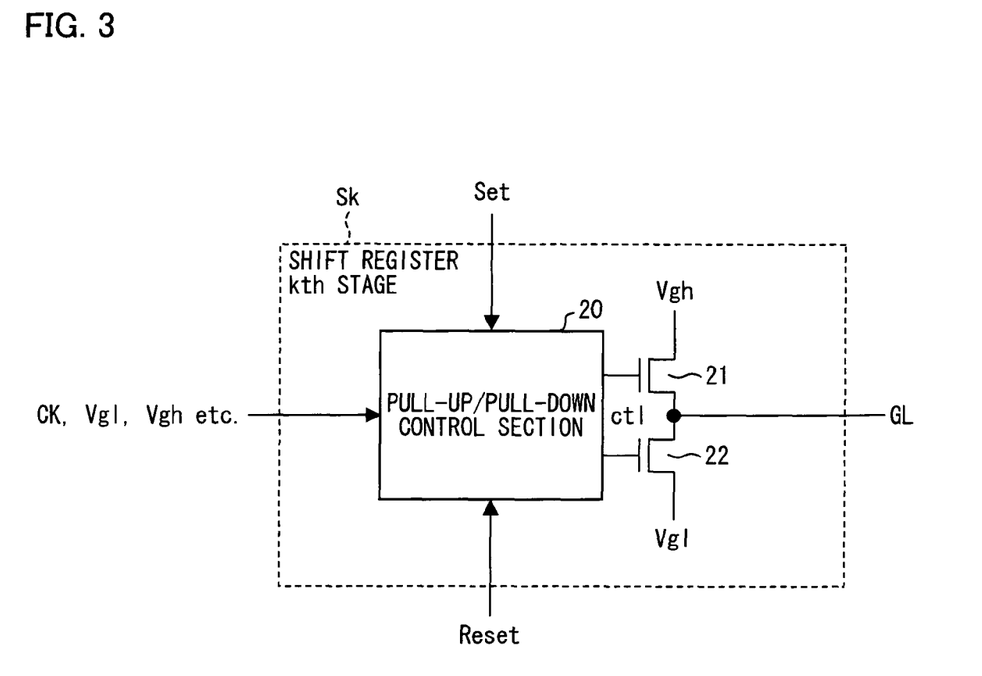
FIG. 3 is a circuit block diagram illustrating an arrangement of a stage in a shift register included in the display device illustrated in FIG. 1.

FIG. 3 illustrates an arrangement of a kth stage S$_k$ ($2 \leq k \leq 2n-1$) of the shift register 4. Note that a first stage S$_1$ and a final stage S$_{2n}$ each has a modified arrangement of the arrangement illustrated in FIG. 3, as in a conventional technique.

The stage S$_k$ includes a pull-up/pull-down control section 20, a pull-up section (pull-up means) 21, and a pull-down section (pull-down means) 22.

The pull-up/pull-down control section 20 supplies an output control signal ctl to each of the pull-up section 21 and the pull-down section 22. The pull-up section 21 and the pull-down section 22 constitute an output section for supplying a scanning signal to a corresponding scanning signal line GL. During a non-selection period of pixels PIX connected to the stage S$_k$, the output control signal ctl gives an instruction to supply a Low gate voltage to the scanning signal line GL. In response to this, the pull-down section 22 supplies, to the scanning signal line GL, a low-side voltage Vgl of a scanning signal supplied from the wires 5. The stage S$_k$ generates a set signal Set, that is used in a flip-flop of the stage S$_k$, with the use of a predetermined number of shift signals supplied from a previous stage S based on timing of a clock signal CK supplied from the wires 5. As described later, this is because an output impedance is set for each of the stages, and such a set signal Set is generated in such a manner that each set signal corresponds to the stage to which the set signal is to be supplied. Specifically, the stage S$_k$ may be realized by a conventional arrangement in which a logical circuit and a switching element are used. In each of the first stage S$_1$ and the final stage S$_{2n}$, in a case where an output impedance is set in a similar manner to the stage S$_k$, set signals Set may be generated, in accordance with the output impedance, in such a manner that each set signal corresponds to the stage to which the set signal is to be supplied, and in a case where an output impedance is set in a different manner from the stage S$_k$, set signal Set may be generated, independently of the stage S$_k$, in such a manner that each set signal corresponds to the stage to which the set signal is to be supplied. In a case where the set signals Set are generated as above, it is possible to stably operate the shift register.

With the use of the set signal Set, the stage S$_k$ generates a shift signal and an output control signal ctl to be supplied to a subsequent stage. The output control signal ctl gives to an instruction to supply a High gate voltage to the scanning signal line GL. In response to this, the pull-up section 21 supplies, to the scanning signal line GL, a high-side voltage Vgh of a scanning signal supplied from a power supply circuit. Thus, a selection period of the pixels PIX connected to the stage S$_k$ starts. Subsequently, when a predetermined number of predetermined signals are supplied, as reset signals Reset, from the subsequent stage S to the stage S$_k$, the output control signal ctl gives an instruction to supply a Low gate voltage to the scanning signal line GL. In response to this, the pull-down section 22 supplies a voltage Vgl to the scanning signal line GL. Thus, the selection period of the pixel PIX is finished. Note that the reset signals Reset are not necessarily required.

A signal system shown in FIG. 3 is an example, and any signal system may be employed.

In FIG. 3, each of the pull-up section 21 and the pull-down section 22 is constituted by an n-channel type TFT. A drain of the TFT of the pull-up section 21 is connected to a power supply of a voltage Vgh, and a source of the TFT of the pull-up section 22 is connected to a power supply of a voltage Vgl. The power supply of the voltage Vgh may be a power supply of a clock signal. A source of the pull-up section 21 and a drain of the pull-down section 22 are connected to each other, and a point at which the source of the pull-up section 21 and the drain of the pull-down section 22 are connected to each other is connected to the scanning signal line GL. In a case where the output control signal ctl gives an instruction to supply a High gate voltage to the scanning signal line GL, the TFT of the pull-up section 21 is brought into an ON state, and the TFT of the pull-down section 22 is brought into an OFF state. Meanwhile, in a case where the output control signal ctl gives an instruction to supply a Low gate voltage to the scanning signal line GL, the TFT of the pull-up section 21 is brought into the OFF state, and the TFT of the pull-down section 22 is brought into the ON state.

Figure 4:
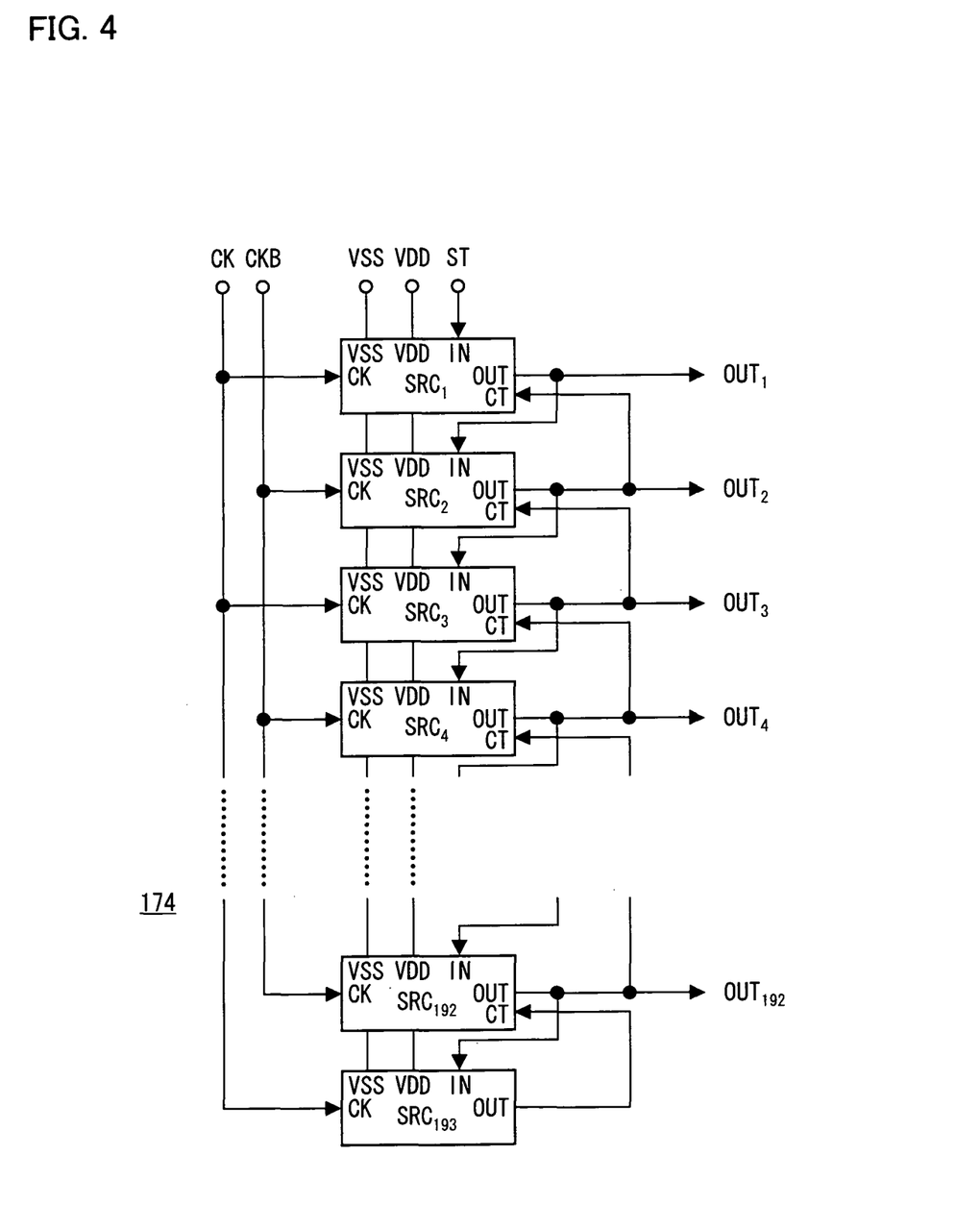
FIG. 4 is a block diagram illustrating an exemplary arrangement of the shift register included in the display device illustrated in FIG. 1.

The shift register 4 may be arranged as shown in FIG. 6 of Patent Literature 2, for example (see FIG. 4).

In FIG. 4, stages $SRC_1$ through $SRC_{193}$ correspond to the stages S of the shift register 4, respectively. Further, clock signals CK and CKB correspond to the clock signals which have opposite phases to each other and which are supplied from the driver 3 to the shift register 4 via the wires 5. A start signal ST corresponds to the start pulse signal supplied from the driver 3 to the shift register 4 via the wires 5. Output signals $OUT_1$, $OUT_2$ . . . of the respective stages are supplied to scanning signal lines GL to which the respective stages are connected.

Figure 5:
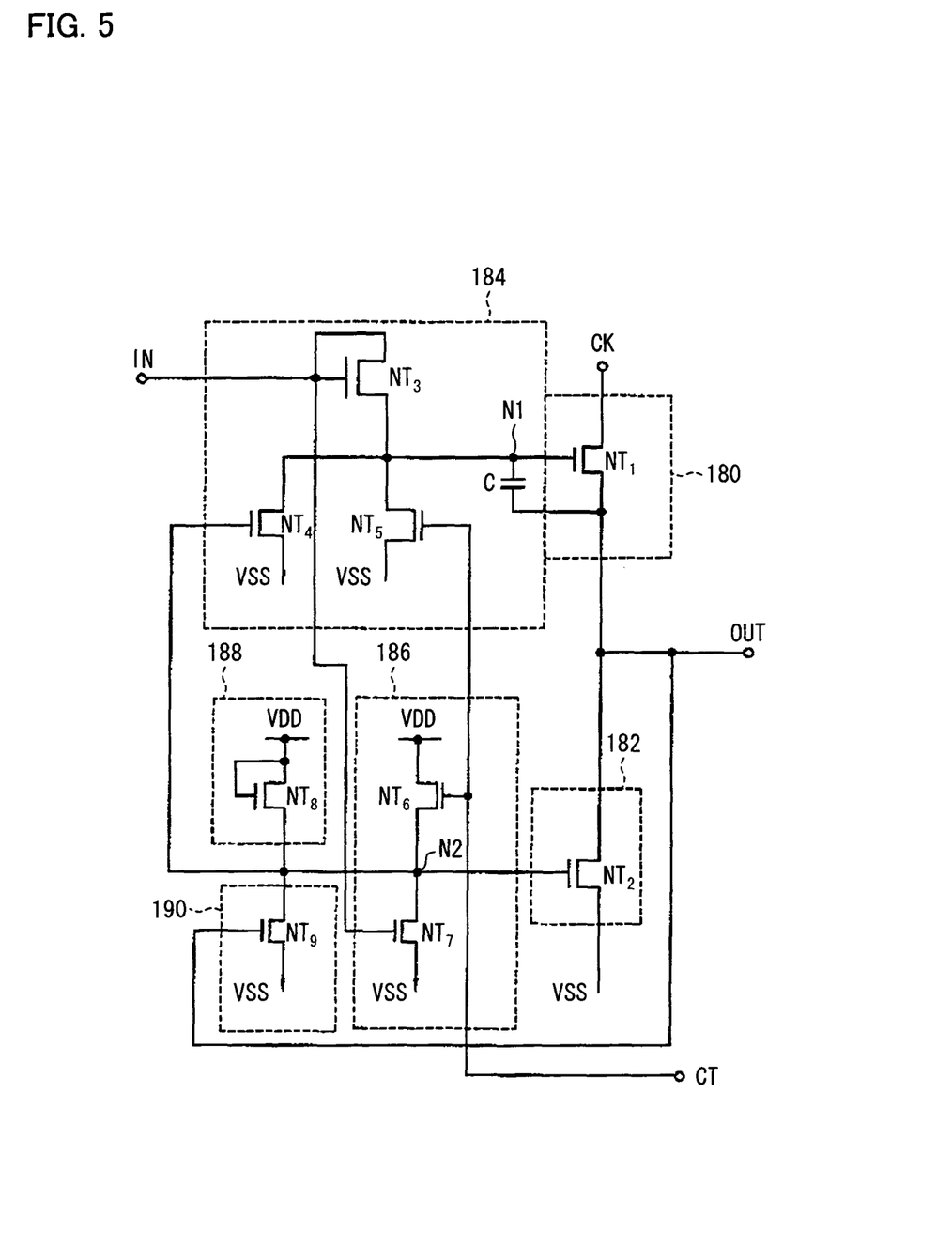
FIG. 5 is a circuit diagram illustrating an exemplary arrangement of a stage in the shift register illustrated in FIG. 4.

Further, each of the stages of the shift register of FIG. 4 may be arranged as shown in FIG. 7 of Patent Literature 2, for example (see FIG. 5). Pull-up means 180 corresponds to the pull-up section 21, and pull-down means 182 corresponds to the pull-down section 22. Constituents other than the pull-up means 180 and the pull-down means 182 correspond to the pull-up/pull-down means control section 20. Further, a capacitance C of FIG. 5 is a bootstrap capacitance, and is effective in a case of an AC source input. A change in potential of the drain of the pull-up section 21 causes a change in gate potential via the bootstrap capacitance C. In a case where a shift from a non-conductive period to a conductive period occurs, the gate potential becomes high. The larger the capacitance becomes, the higher the gate potential becomes. Accordingly, an output impedance becomes smaller.

The following description deals with how the non-rectangular odd shape of the pixel region AR1 affects display quality. In a case where a scanning signal supplied from each stage S of the shift register 4 has a waveform close to an ideal rectangular pulse composed of High and Low, such a waveform falls steeply, as indicated by the broken line in (a) of FIG. 6. Thus, the TFT 11 of the pixel PIX is shifted from an ON state to an OFF state, i.e., shifted from a conductive period to a non-conductive period. When the TFT11 is shifted from the ON state to the OFF state, a so-called pull-in effect in which potential of the pixel electrode changes occurs due to the parasitic capacitance Cgd formed between the pixel electrode 12 and the scanning signal line GL (see FIG. 2).

When the TFT 11 is shifted from an ON state to an OFF state, the potential of the pixel electrode declines by $\Delta V$, where $\Delta V$ is a pull-in voltage indicating an amount of change in potential of the pixel electrode. This is shown by the solid line in (a) of FIG. 6. The longer the scanning signal line GL becomes in the pixel region AR1, the larger wiring delay becomes since the wiring delay corresponds to a sum of (i) wiring resistance of the scanning signal line GL, (ii) wiring capacitance of the scanning signal line GL, and (iii) gate capacitance of the TFTs 11 connected to the scanning signal line GL. As such, since the number of TFTs 11 connected to a scanning signal line GL is almost proportional to length of the scanning signal line GL, the number of TFTs 11 connected to a scanning signal line GL indicates largeness of a wiring delay of the scanning signal line GL. In a case where such a wiring delay is large, a scanning signal has a waveform which falls gradually (see (b) of FIG. 6). In this case, the pull-in voltage $\Delta V$ becomes smaller than that in (a) of FIG. 6 in accordance with the increase in wiring delay. Thus, even if the same data signal is supplied to the pixel electrodes, an in-plane distribution of potential of the pixel electrodes occurs in the pixel region AR1. This causes deterioration in display quality.

In view of this, according to the present embodiment, each of the stages S of the shift register 4 is arranged in accordance with the number of TFTs 11 connected to a scanning signal line GL to which the stage corresponds, i.e., largeness of a wiring delay of the corresponding scanning signal line GL. Specifically, each of the stages of the shift register 4 is arranged such that an output impedance is set in accordance with the number of TFTs 11 connected to a scanning signal line GL to which the stage corresponds. In this case, the first stage and the final stage may be arranged so as to be different from the other stages S in how a signal is inputted and outputted, and the stages S other than the first stage and the final stage may be arranged such that an output impedance is set in accordance with the number of TFTs 11 connected to a scanning signal line GL to which the stage corresponds.

In the present embodiment, each of the stages is especially arranged such that a transistor (first transistor) constituting the pull-up section 21 of the output section has a larger channel width as the number of TFTs 11 connected to a scanning signal line GL to which the stage corresponds becomes larger. As the channel width of the transistor constituting the pull-up section 21 becomes larger, an ON resistance of the transistor constituting the pull-up section 21 becomes smaller, i.e., an output impedance becomes smaller in a transient state from the non-conductive period to the conductive period of the TFTs 11.

Therefore, in a case where a channel width of each of the pull-up sections 21 is set in accordance with a wiring delay of a scanning signal line GL to which the pull-up section 21 corresponds, one scanning signal line GL is the same as another scanning signal line GL in wiring delay of an entire series circuit constituted by the pull-up section 21 and a scanning signal line GL to which the pull-up section 21 corresponds, i.e., rising waveform of a scanning signal. Note that each of the stages may include, in a predetermined position other than an area where the pull-up section 21 is provided, the first transistor whose channel width becomes larger as the number of TFTs 11 connected to a scanning signal line GL to which the stage corresponds becomes larger so that an output impedance becomes smaller.

In the arrangement in which a channel width of the pull-up section 21 is adjusted, one scanning signal line GL is the same as another scanning signal line GL in rising waveform of a scanning signal, and therefore one scanning signal line GL is the same as another scanning signal line GL in timing for starting writing display data into pixels PIX. This allows an odd-shaped display device which is not rectangular in shape to carry out sequential scanning equally with respect to the scanning signal lines based on the same horizontal period so that pixels PIX connected to each of the scanning signal lines are sequentially scanned, as in a rectangular-shaped display device.

Further, each of the stages may be arranged such that a channel width of a transistor (first transistor) constituting the pull-down section 22 of the output section becomes larger as the number of TFTs 11 connected to a scanning signal line GL to which the stage corresponds becomes larger. As the channel width of the transistor constituting the pull-down section 22 becomes larger, an ON resistance of the transistor constituting the pull-down section 22 becomes smaller, i.e., an output impedance becomes smaller in a transient state from the conductive period to the non-conductive period of the TFTs 11. When a certain amount of voltage is applied from the pull-up/pull-down control section 20 to the gate of the pull-down section 22, the pull-down section is brought into an ON state at a certain drain-source voltage in a linear region. Subsequently, as electrical discharge continues in a scanning signal line GL side, a potential of the drain of the pull-down section 22 declines, and therefore the drain-source voltage becomes smaller. As a result, an operation point of the pull-down section 22 gradually moves in the linear region in a direction in which a channel resistance increases. As the channel width of the pull-down section 22 becomes larger, the pull-down section 22 operates in a higher position in the linear region, i.e., operates in an area where the channel resistance is smaller. Accordingly, an output impedance becomes smaller.

In the arrangement in which the channel width of the pull-down section 22 is adjusted, one scanning signal line GL is the same as another scanning signal line GL in falling waveform of a scanning signal, and therefore one scanning signal line GL is the same as another scanning signal line GL in pull-in voltage ΔV. This allows an improvement in display quality.

Therefore, in a case where the channel width of the pull-down section 22 is set in accordance with a wiring delay of a scanning signal line GL to which the pull-down section 22 corresponds, one scanning signal line GL is the same as another scanning signal line GL in wiring delay of an entire series circuit constituted by the pull-down section 22 and the scanning signal line GL to which the pull-down section 22 corresponds, i.e., falling waveform of a scanning signal. Note that each of the stages may include, in a predetermined position other than an area where the pull-down section 22 is provided, the first transistor whose channel width becomes larger as the number of TFTs 11 connected to a scanning signal line GL to which the stage corresponds becomes larger so that an output impedance becomes smaller.

At least one of setting of the channel width of the pull-up section 21 and setting of the channel width of the pull-down section 22 can be carried out. During the conductive period of the TFTs 11 after a transition from a non-conductive period to the conductive period, the transistor of the pull-up section 21 preserves its conductive state obtained at the end of a transient period, whereas during the non-conductive period of the TFTs 11 after a transition from the conductive period to the non-conductive period, the transistor of the pull-down section 22 preserves its conductive state obtained at the end of a transient period. During the conductive period and the non-conductive period of the TFTs 11, a magnitude relationship between an output impedance in one stage and an output impedance in another stage corresponds to a magnitude relationship between a channel width in said one stage and a channel width in said another stage, and is similar to that in a transient period immediately before the conductive period and the non-conductive period, provided that one stage is the same as another stage in gate-source voltage of the transistor of the pull-up section 21 and in gate-source voltage of the transistor of the pull-down section 22. Based on this, in a case where the pull-up section 21 continues to apply an ON voltage to the TFTs 11 during the conductive period of the TFTs 11 or in a case where the pull-down section 22 continues to apply an OFF voltage to the TFTs 11 during the non-conductive period of the TFTs 11, each of the stages of the shift register 4 may be arranged, in at least one of the conductive period and the non-conductive period of the TFTs 11, such that the larger the number of TFTs 11 connected to a scanning signal line GL to which the stage corresponds becomes, the smaller an output impedance becomes.

Further, TFTs 11 of respective pixels PIX may be brought into a conductive state with the use of a Low level scanning signal and brought into a non-conductive state with the use of a High level scanning signal. As such, the pull-down section 22 may be used as means for applying an ON voltage to the TFTs during the conductive period of the TFTs, and the pull-up section 21 may be used as means for applying an OFF voltage to the TFTs during the non-conductive period of the TFTs.

Further, another arrangement is possible in which both of the transistors of the pull-up section 21 and the pull-down section 22 are brought into an ON state in a transient state from the non-conductive period to the conductive period of the TFTs 11. In a case where some of electric current flowing through the pull-up section 21 are diverted toward a pull-down section 22 side and a scanning signal line GL side, such electric current flowing toward the scanning signal line GL side varies depending on a channel resistance of the pull-down section 22. In view of this, (i) a transistor size of the pull-up section 21 in one stage is set to be identical to that in another stage and (ii) a transistor size of the pull-down section 22 is set to be smaller as the number of TFTs 11 connected to a scanning signal line GL to which the pull-down section 22 corresponds becomes larger so that an output impedance becomes smaller. This increases the electric current flowing toward the scanning signal line GL. Such a reduction in transistor size can be achieved by reducing a channel width. Further, a reduction in output impedance may be achieved also by increasing a channel length of the pull-down section 22.

Independently of the above arrangement or in addition to the above arrangement, each of the stages of the shift register 4 may be arranged so as to include, in a predetermined position, a first capacitance element whose capacitance value becomes larger as the number of TFTs 11 connected to a scanning signal line GL to which the stage corresponds becomes larger so that an output impedance becomes smaller.

A channel width of each transistor in each of the stages of the shift register 4 remains same or becomes larger as the number of TFTs connected to a scanning signal line GL to which the stage corresponds becomes larger.

A capacitance value of each capacitance element in each of the stages of the shift register 4 remains same or becomes larger as the number of TFTs connected to a scanning signal line GL to which the stage corresponds becomes larger.

Figure 6:
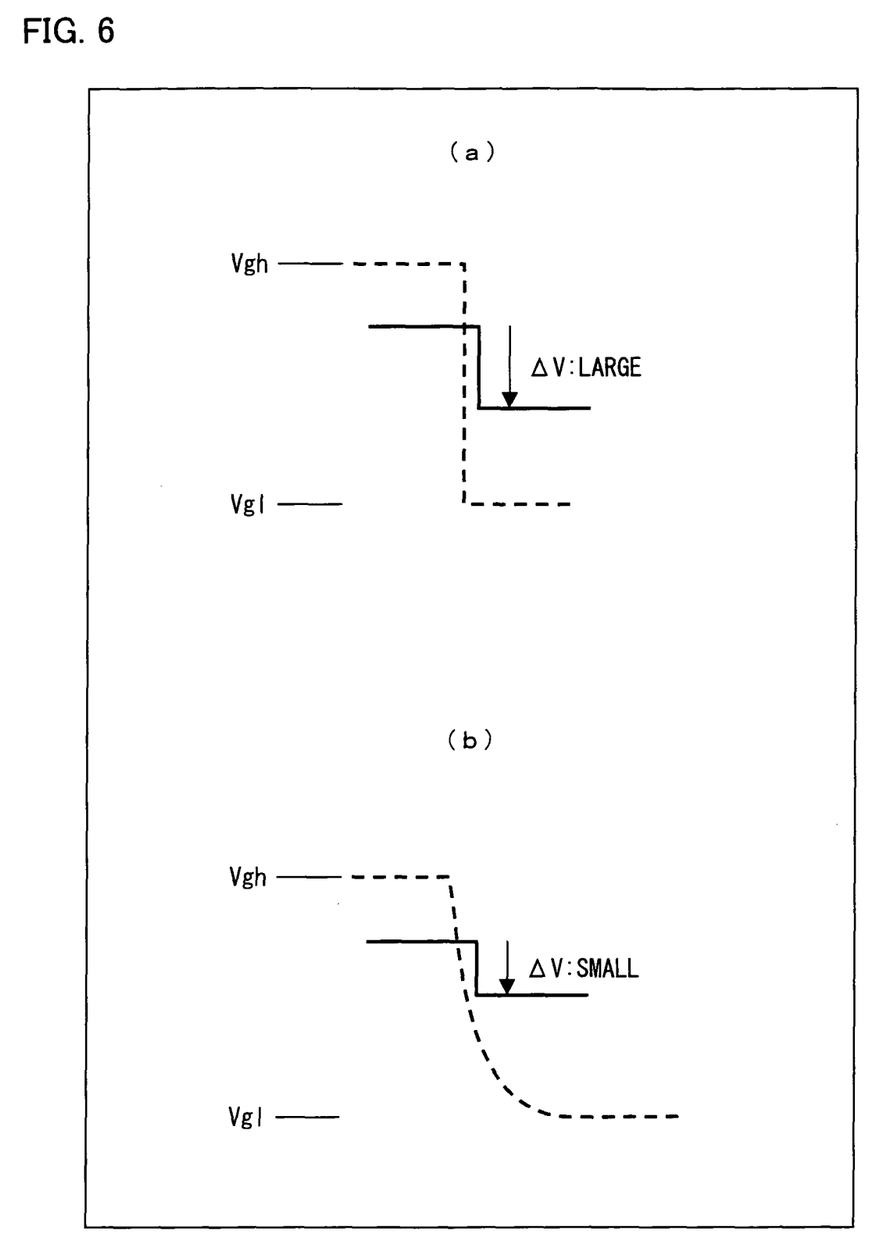
FIG. 6 is a waveform chart for explaining a pull-in effect of a pixel. (a) of FIG. 6 shows a pull-in voltage obtained in a case where a wiring delay of a scanning signal is small, and (b) of FIG. 6 shows a pull-in voltage obtained in a case where the wiring delay of the scanning signal is large.

The above description has discussed a difference between a wiring delay in one scanning signal line GL and a wiring delay in another scanning signal line GL. However, distribution of signal delay occurs even in a single scanning signal line GL since resistive components and capacitive components are distributed. In a pixel PIX which is close to an output section of a stage S of the shift register 4 in the pixel region AR1, a scanning signal has a waveform close to that shown in (a) of FIG. 6, and therefore a pull-in voltage ΔV having magnitude shown in (a) of FIG. 6 is generated. Meanwhile, in a pixel PIX which is far from an output section of a stage S of the shift register 4 in the pixel region AR1, a scanning signal tends to have a waveform close to that shown in (b) of FIG. 6 due to an influence of a wiring delay of a scanning signal line GL. In this case, the pull-in voltage ΔV is smaller than that shown in (a) of FIG. 6, the pull-in voltage ΔV becoming smaller as a distance between the pixel PIX and the output section becomes larger. Thus, even if the same data signal is supplied to the pixel electrodes, an in-plane distribution of potential of the pixel electrodes occurs in a single scanning signal line GL. This causes deterioration in display quality.

Figure 7:
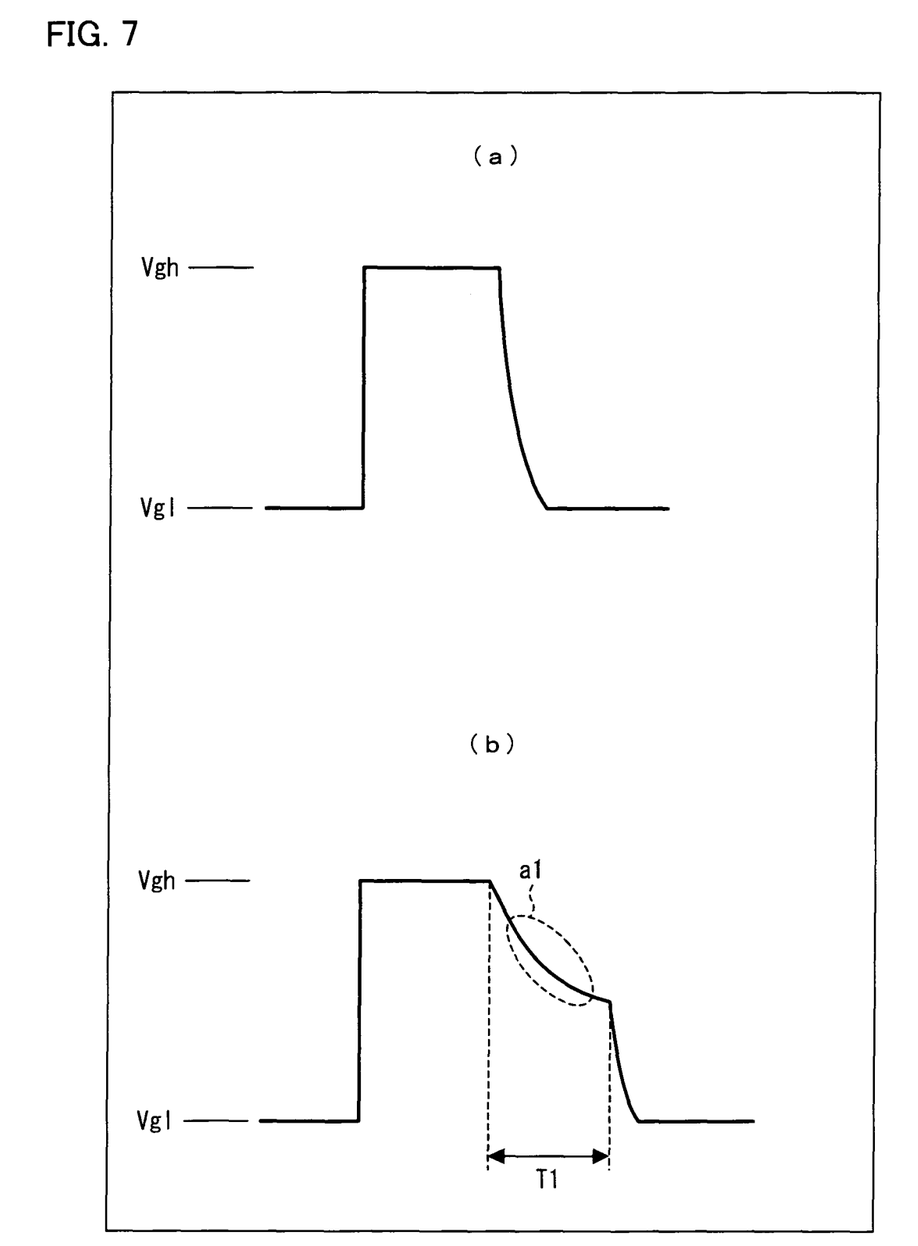
FIG. 7 is a waveform chart illustrating a waveform of a scanning signal supplied from the shift register included in the display device illustrated in FIG. 1. (a) of FIG. 7 shows a normal waveform, and (b) of FIG. 7 shows a waveform which falls in a stepwise manner.
Figure 8:
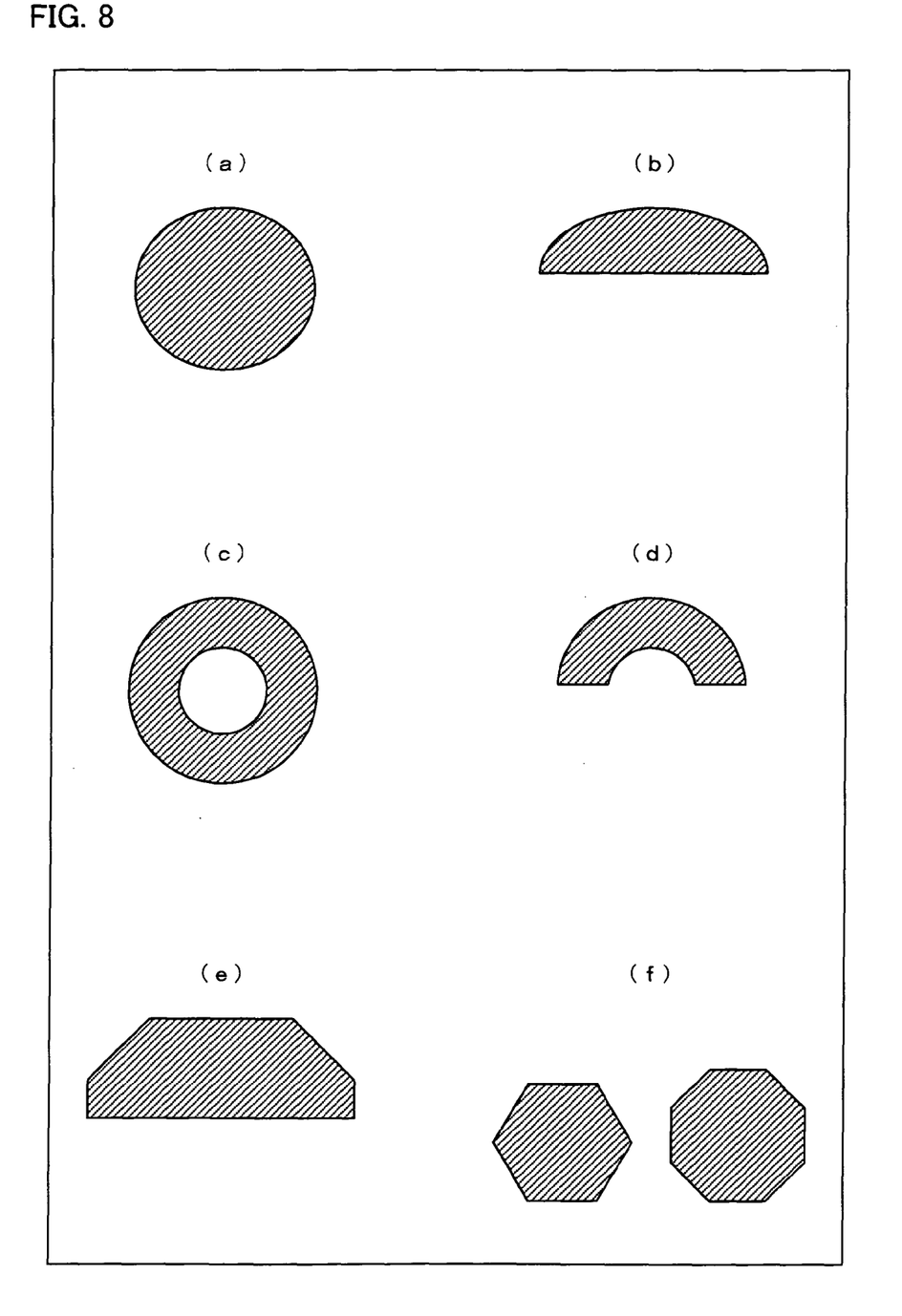
FIG. 8 is a plan view illustrating exemplary shapes of an odd-shaped pixel region that is not rectangular in shape. (a) through (f) of FIG. 8 illustrate the exemplary shapes, respectively.

In view of this, a scanning signal supplied from each of the stages S of the shift register 4 is caused to have a waveform a1 shown in (b) of FIG. 7 rather than a normal waveform shown in (a) of FIG. 7. In the normal waveform shown in (a) of FIG. 7, a voltage rises from a voltage Vgh directly to a voltage Vgl, whereas in the waveform a1, a voltage gradually falls from a voltage Vgh during a period T1 which is the first half of a falling period, and then falls to a voltage Vgl so that a stepwise waveform is formed. This allows the scanning signal to have the approximately same falling waveform in any position in a single scanning signal line GL, thereby allowing pull-in voltages ΔV to be identical to one another.

The liquid crystal display panel 1 may be contained in a case together with a light-source unit, a control circuit, a power supply unit, and the like so that a display device can be obtained. Since the liquid crystal display panel 1 includes the image region AR1 that is not rectangular in shape, other components constituting the display device can be provided in parts from which unnecessary parts such as corner sections of a panel substrate are removed by cutting.

The above embodiment has discussed a case where the image region AR1 has an oval shape. However, such an odd-shaped image region AR1 that is not rectangular in shape may have other shapes. For example, the image region AR1 can have a circular shape (see (a) of FIG. 8), a semicircular shape or a squashed semicircular shape (see (b) of FIG. 8), an annular shape (see (c) of FIG. 8), a semiannular shape (see (d) of FIG. 8), a shape in which corner sections are removed from a rectangle by cutting and in which cut edges are straight or curved (see (e) of FIG. 8), and a polygonal shape (e.g. hexagon or octagon) which is not rectangular (see (f) of FIG. 8).

Further, the above embodiment has discussed a case where a shift register is provided in one of regions which are adjacent to the image region AR1 in a direction in which a scanning signal line GL extends. However, this is not the only possibility. The shift register may be provided in both of the regions which are adjacent to the image region AR1 in a direction in which a scanning signal line GL extends. In this case, it is possible to decide which scanning signal line GL corresponds to which shift register. For example, odd-numbered rows of scanning signal lines GL may correspond to a shift register which is different from a shift register corresponding to even-numbered rows of scanning signal lines GL. Alternatively, it is possible that the same kind of signals are supplied from both of the shift registers to the scanning signal lines GL at the same timing.

Further, the above embodiment has discussed a case where a TFT is used as a three terminal element of a pixel PIX. However, this is not the only possibility. Such a three terminal element may be other three terminal elements such as a general MOS transistor.

Further, the above embodiment has discussed a case where liquid crystal is used as a display medium. However, this is not the only possibility. Such a display medium may generally be a display medium (e.g. EL display element) driven by a matrix wiring.

Further, the above embodiment has discussed a case where an n-channel type TFT is used as an output section of a stage S of the shift register 4. Such an output section may be constituted by a TFT of any polarity such as a p-channel type TFT or a pn-channel type TFT.

The present invention is not limited to the description of the embodiments above, but may be altered by a skilled person within the scope of the claims. An embodiment based on a proper combination of technical means disclosed in different embodiments is encompassed in the technical scope of the present invention.

A display panel of the present invention includes: an active matrix type pixel region including scanning signal lines each of which is connected to three terminal elements each of which serves as an active element, the active matrix type pixel region having a non-rectangular shape by being configured such that the respective scanning signal lines are connected with various numbers of the three terminal elements according to where the scanning signal lines are located, and a shift register which drives the scanning signal lines, the shift register being formed in a region on a panel substrate, the region being adjacent to the pixel region in a direction in which the scanning signal lines extend.

With this arrangement, it is possible to realize a display panel which includes an odd-shaped pixel region that is not rectangular in shape, and in which an area where peripheral wires are routed outside the pixel region can be reduced.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

INDUSTRIAL APPLICABILITY

The present invention can be suitably applied to a display device in general.

The invention claimed is:
1. A display panel comprising:
an active matrix type pixel region including scanning signal lines each of which is connected to three terminal elements each of which serves as an active element, the active matrix type pixel region having a non-rectangular shape by being configured such that the respective scanning signal lines are connected with various numbers of the three terminal elements according to where the scanning signal lines are located, and
a shift register which drives the scanning signal lines, the shift register being formed in a region on a panel substrate, the region being adjacent to the pixel region in a direction in which the scanning signal lines extend, wherein
the shift register includes that plurality of the stages which have an arrangement such that an output impedance in at least one of a transient state from a non-conductive period to a conductive period of the three terminal elements and a transient state from the conductive period to the non-conductive period of the three terminal elements is set in accordance with the number of the three terminal elements connected to that one of the scanning signal lines to which the stage corresponds.

2. The display panel according to claim 1, wherein:
the shift register includes stages disposed along a part of a periphery of the pixel region which part is adjacent to the shift register, and
a part of a periphery of the panel substrate which part is adjacent to the shift register has a shape curved according to a curved shape of the part of the periphery of the pixel region.

3. The display panel according to claim 1, wherein:
the shift register includes that plurality of the stages which have an arrangement such that an output impedance in at least one of the conductive period of the three terminal elements and the non-conductive period of the three terminal elements is set in accordance with the number of the three terminal elements connected to that one of the scanning signal lines to which the stage corresponds.

4. The display panel according to claim 1, wherein:
the stages except a first stage and a last stage include stages having the arrangement.

5. The display panel according to claim 1, wherein:
each of the stages in the shift register which stages have the arrangement includes a first transistor in a predetermined position, the first transistor having a channel width which becomes larger as the number of the three terminal elements connected to the scanning signal line to which the stage corresponds becomes larger, the output impedance becoming smaller as the channel width of the first transistor becomes larger.

6. The display panel according to claim 5, wherein:
the first transistor is a transistor that is provided in an output section for supplying a scanning signal to the scanning signal line to which the stage corresponds.

7. The display panel according to claim 6, wherein:
the output section includes pull-up means which generates a high-side voltage of the scanning signal and pull-down means which generates a low-side voltage of the scanning signal, and
the first transistor serves as the pull-up means.

8. The display panel according to claim 6, wherein:
the output section includes pull-up means which generates a high-side voltage of the scanning signal and pull-down means which generates a low-side voltage of the scanning signal, and
the first transistor serves as the pull-down means.

9. The display panel according to claim 1, wherein:
each of the stages in the shift register which stages have the arrangement includes a first transistor in a predetermined position, the first transistor having a channel length which becomes smaller as the number of the three terminal elements connected to the scanning signal line to which the stage corresponds becomes larger, the output impedance becoming smaller as the channel length of the first transistor becomes smaller.

10. The display panel according to claim 1, wherein:
each of the stages in the shift register which stages have the arrangement includes a first capacitance element in a predetermined position, the first capacitance element having a capacitance value which becomes larger as the number of the three terminal elements connected to that one of the scanning signal line to which the stage corresponds becomes larger, the output impedance becoming smaller as the capacitance value of the first capacitance element becomes larger.

11. The display panel according to claim 1, wherein:
a channel width of each transistor in each of the stages of the shift register remains same or becomes larger as the number of the three terminal elements connected to that one of the scanning signal lines to which the stage corresponds becomes larger.

12. The display panel according to claim 1, wherein:
a capacitance value of each capacitance element in each of the stages of the shift register remains same or becomes larger as the number of the three terminal elements connected to that one of the scanning signal lines to which the stage correspond becomes larger.

13. The display panel according to claim 1, wherein:
the scanning signal has a waveform which falls from High to Low in a stepwise manner.

14. The display panel according to claim 1, wherein:
set signals respectively supplied to the stages in the shift register which stages have the arrangement are generated in such a manner that each set signal corresponds to the stage to which the set signal is to be supplied.

15. The display panel according to claim 1, wherein:
the display panel is a liquid crystal display panel.

16. A display device comprising a display panel recited in claim 1.

* * * * *